United States Patent [19]
Veneklasen et al.

[11] Patent Number: 5,729,022
[45] Date of Patent: Mar. 17, 1998

[54] COMPOSITE CONCENTRIC-GAP MAGNETIC LENS AND DEFLECTOR WITH CONICAL POLE PIECES

[75] Inventors: Lee H. Veneklasen, Castro Valley; William J. DeVore, Hayward, both of Calif.

[73] Assignee: Etec Systems, Inc., Hayward, Calif.

[21] Appl. No.: 721,287

[22] Filed: Sep. 26, 1996

[51] Int. Cl.⁶ ........................................... H01J 3/22
[52] U.S. Cl. ............................... 250/396 ML; 335/210
[58] Field of Search ............... 250/396 ML; 335/210

[56] References Cited

U.S. PATENT DOCUMENTS

| | | |
|---|---|---|
| 4,419,581 | 12/1983 | Nakagawa ............... 250/396 ML |
| 4,469,948 | 9/1984 | Veneklasen et al. .......... 250/396 ML |
| 5,038,045 | 8/1991 | Rouberol et al. ............ 250/396 ML |

*Primary Examiner*—Jack I. Berman
*Attorney, Agent, or Firm*—Skjerven, Morrill, MacPherson, Franklin & Friel; Norman R. Klivans

[57] ABSTRACT

A composite magnetic lens and deflector for particle beam optical systems has a concentric gap and concentric conical lower pole pieces arranged to allow more accurate magnetic deflection. The flux generated by a solenoidal lens coil is shared by magnetically soft inner and higher saturation flux outer pole pieces to minimize saturation effects, while the flux generated by internal deflection coils is confined to magnetically soft inner pole pieces that minimize flux leakage and associated eddy current settling effects. Shielding rings further contain leakage flux. The inner magnetic circuit is mounted and adhesively bonded to radial flexures to minimize thermal expansion drifts.

16 Claims, 3 Drawing Sheets

COMPOSITE CONCENTRIC-GAP MAGNETIC LENS AND DEFLECTOR WITH CONICAL POLE PIECES

BACKGROUND OF THE INVENTION

1. Field of the Invention

This invention relates to charged particle beams, and more specifically to a magnetic lens and deflector for deflecting such beams.

2. Description of the Prior Art

Electron beam lithography, electron beam inspection systems and scanning electron microscopes usually use a magnetic objective "lens" to focus a (charged) particle beam, and magnetic deflection coils mounted within the lens to accurately position the focused beam upon a substrate.

The magnetic properties of the deflection optics are critical for achieving fast and accurate beam placement. In particular, the relationship between focusing magnetic field of the lens and the deflection field must be optimized for minimum deflection aberrations and normal landing angle. The return magnetic flux from the deflection coils must be confined within a magnetically soft, high resistivity low hysteresis enclosure that discourages eddy current effects that can cause the beam to settle slowly after a change in deflection current. The charged particles are e.g. electrons and ions. "Soft" in the context of magnetism means low remanence (low coercive force). "Hard" means the opposite. Thus a permanent magnet is of a magnetically hard material.

Prior art magnetic objective lens systems enclose the deflection coils in cylindrical shaped outer return yokes or a series of rings to confine the deflection flux. These yokes or rings often serve as concurrently as pole pieces for the static magnetic lens field generated by a solenoidal lens excitation coil located outside the pole piece structure. In this overlaid structure the focussing magnetic flux flows in axially symmetric paths while the magnetic flux from the deflection coils follows an azimuthal path from one side of the pole pieces to the other. Thus gaps that provide a focusing field on the lens axis can still provide a continuous return path for the deflection flux.

The pole pieces surrounding the deflection system must be of a magnetically very soft material with minimum hysteresis, since otherwise the relationship between deflection coil current and deflected beam position depends upon past deflection history. In addition, the deflection system enclosure must confine all deflection flux, for otherwise flux leakage causes eddy currents in surrounding material. These eddy currents can generate opposing magnetic fields that would temporarily influence the flux distribution, causing the deflection to settle more slowly than desired. (Rapid changes in deflection are advantageous.)

To avoid saturation effects due to axial lens fields, a composite concentric-gap magnetic lens was earlier disclosed by the present inventors; see U.S. Pat. No. 4,469,948 issued Sep. 4, 1984 showing use of one or more sets of cylindrical inner pole pieces, made of a magnetically soft material such as ferrite, arranged concentrically within a magnetic lens circuit excited by a solenoidal excitation coil and whose outer pole pieces are made of a material that supports a higher saturation flux. Magnetic flux is shared between the inner and outer pole pieces in such a way that saturation of the inner pole piece is avoided because excess flux is shunted through the outer pole piece. This assures a linear relationship between the axial lens field and the excitation current at all points along the beam paths which is essential for optimum deflection optics. As is now understood by us to be equally important, but not emphasized in that disclosure, the concentric geometry assures that the magnetic permeability of the deflection return path formed by the inner pole pieces remains high. This minimizes settling effects that would otherwise occur if flux escaped the inner enclosure. The net result is a more linear relationship between deflection current and beam position in a high bandwidth deflection system.

Present FIG. 1 is the structure disclosed in U.S. Pat. No. 4,469,948. A deflection coil 1 is enclosed within cylindrical inner pole pieces 2, 3 of a magnetically soft material such as ferrite. Pole pieces 2, 3 define a lens gap 4 that creates a focusing field along the lens axis. Surrounding this inner enclosure is an outer lens circuit excited by a solenoid excitation coil 5 and made of a higher saturation material to form a second set of outer concentric pole piece elements 6, 7. To avoid sharing of deflection flux, the inner pole piece structure is separated by a gap 8 at either end from the outer pole pieces 7. Composite lenses of this type have been used successfully for many years.

More advanced particle beam optics applications will require stronger lens fields and even faster and more accurate deflection. Higher beam energies require stronger lens fields that could exaggerate saturation effects. Improved deflection optics favors multi-stage deflection coils placed in strategic locations along the beam path. In particular, it has been found to be desirable to place at least one deflection coil near the exit of the lens, downstream of the maximum lens field. These new optimization requirements suggest modifications to the original lens geometry.

The lateral position of the inner pole pieces of a magnetic lens determines its electron optical center. It is critical this center not move laterally, because this leads to uncontrolled drift of the beam position. Lens and deflection coils generate heat which leads to temperature changes within the lens, so lateral movement of the lens center due to thermal expansion can be a problem. Features of the lens circuit design can alleviate this problem.

Hence there is a need to improve a composite concentric-gap magnetic lens and deflection system, providing a more effective deflection geometry while still avoiding saturation and flux leakage effects, and to minimize thermal expansion drift.

SUMMARY

The present magnetic lens and deflector includes concentric lower inner pole pieces of a conical shape to provide a return path for a lower magnetic deflection yoke, allowing a deflection coil to be placed "downstream" of the main lens magnetic field. The conical pole pieces act in conjunction with conventional cylindrical upper inner pole pieces to form a lens magnetic field and provide a return yoke for deflection coils. A set of thin, ring-shaped shield rings within the inner pole piece lens gap shield the gap deflection flux that would otherwise escape through a larger gap. The inner pole pieces are adhesively bonded in place on radial flexures that locate and magnetically isolate the inner magnetic enclosure while minimizing lateral shift resulting from thermal expansion.

DETAILED DESCRIPTION

Figure 1:
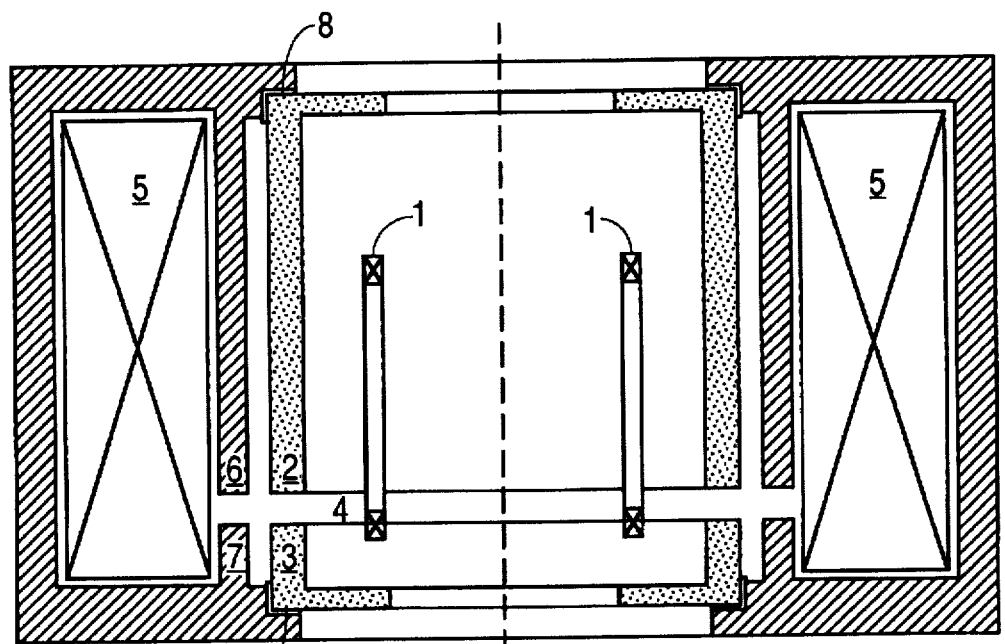
FIG. 1 shows in cross section a prior art cylindrical composite-gap pole piece magnetic lens structure of commonly invented U.S. Pat. No. 4,469,448.
Figure 2:
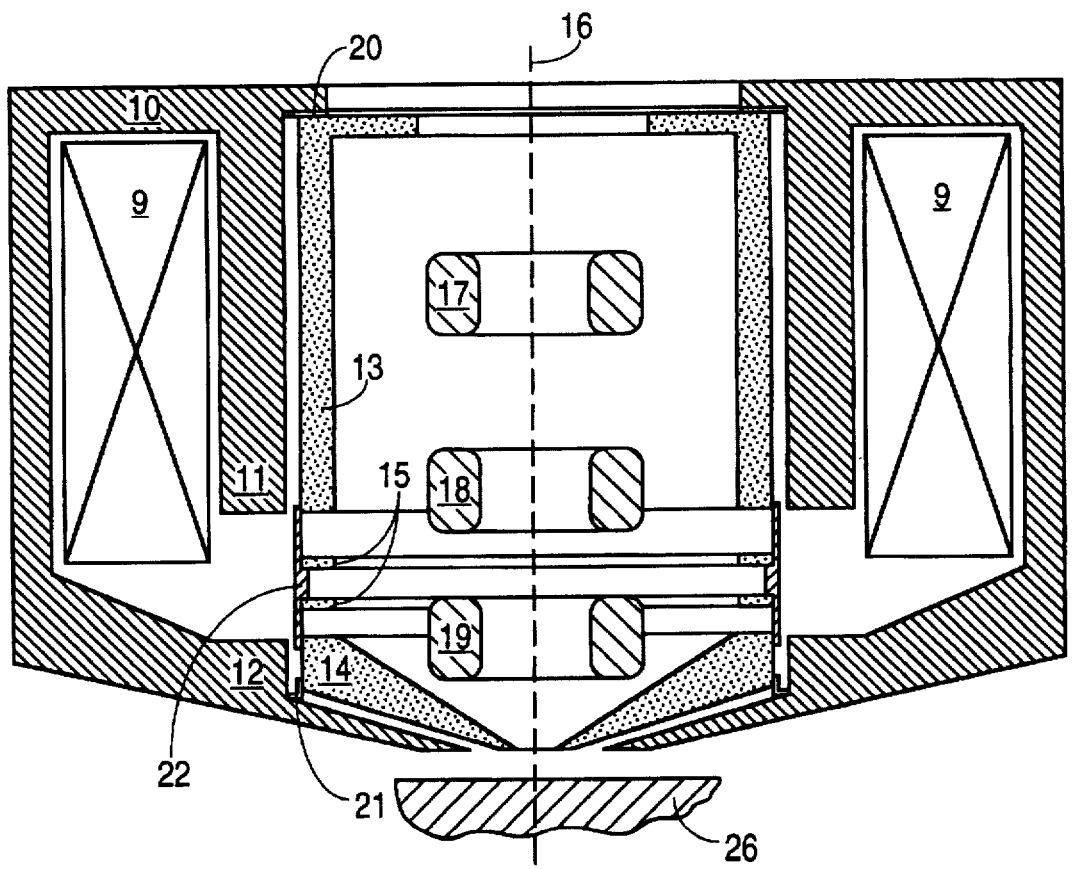
FIG. 2 shows in cross section improvements according to this inventions including conical concentric lower pole pieces with shielding rings and a bonded radial flexure.

FIG. 2 illustrates in cross section a composite-gap magnetic lens according to this invention. The outer body of the lens includes a magnetic circuit 10 enclosing a solenoidal excitation coil 9 and a cylindrical upper pole piece 11 and a conical lower pole piece 12. (This lens is axially symmetric.) This outer magnetic circuit 10 is made of a high saturation flux material such as iron. When the excitation coil 9 is excited, flux from the pole pieces 11, 2 generates an axial focusing field within the lens to focus a particle beam 16. (The source of the particle beam and the upstream optics such as apertures and focussing lenses are not shown; see e.g. FIG. 1 of U.S. Pat. No. 4,469,448 for a description of these conventional elements.)

Arranged concentrically within the outer lens circuit is a cylindrical inner upper pole piece 13 similar to that of the prior art. The lower inner pole piece 14 is of a novel conical shape that nests into the similar shaped lower outer pole piece 12 with a small gap in between. FIG. 2 shows a cross section; both elements 14 and 12 are axially symmetric, each defining a truncated cones with the open apex of the core near the beam target (substrate) 26. Within the inner lens gap between inner pole pieces 13 and 14 lies one or more thin shield rings 15. The elements 13, 14, 15 of the inner pole piece enclosure are of a magnetically "soft" material such as ferrite, which is chosen for its low hysteresis and good high frequency response, at the expense of lower saturation limit.

A set of one or more deflection coils 17, 18, 19, wound either in a toroidal or saddle pattern, are located along the beam path within the lens. The lower coil 19 is located below the lens gap in one embodiment in order to improve deflection performance. The coil arrangement of FIG. 2 is not limiting; alternatively there are more or fewer coils. The magnetically isolated conical inner lower pole piece 14 carries the return flux from coil 19 while some of the lens flux is shunted through the outer conical pole piece 12. The conical geometry of the lower part of the lens advantageously extends the lens and deflection magnetic flux as close to the target (substrate) 26 as possible, while preventing this flux from escaping into the region of substrate 26 below the apex of the cone. At the same time, clearance is provided for other elements of the system, e.g. mirrors or fiducial marks which conventionally are part of the stage (support) for substrate 26 and not shown. (While this stage is not shown, it is conventional.) The illustrated tapered cross section of lower pole 12 and of lower inner pole piece 14 enhance this clearance.

The spacing of the outer gap between elements 11, 12 is such that it would produce almost the same axial focusing field in the absence of inner pole elements 13, 14, 15 as the composite lens produces with them. Provided that the outer pole pieces do not magnetically saturate, this assures that the lens field is relatively insensitive to permeability changes in the inner pole piece.

The amount of the gap between the concentric pole pieces is of importance. The magnetic potential between pole pieces depends upon the excitation of the lens coil, so the magnetic field strength in the gap and pole piece faces, (magnetic potential change divided by gap distance), depends upon the gap spacing. However, the axial lens field in the center of the lens depends almost exclusively upon lens diameter and the magnetic potential difference (excitation), so a larger gap reduces the ratio of gap field to focusing field, tending to reduce flux in the pole pieces. Thus higher beam energies favor larger gaps.

These larger gaps undesirably allow deflection flux to escape outwards through the gap. To avoid such leakage, in accordance with the invention one or more thin shielding rings 15 are located within the inner gap. Rings 15 are oriented perpendicular to the magnetic field in the gap, so they have little influence upon the lens field. However, the rings 15 provide a return path for deflection flux that would otherwise radiate through the gap and induce eddy currents in the outer pole pieces and lens coil.

Use of such rings 15 to shield the gap and allow a reduction of flux loading in a concentric pole piece configuration is believed novel.

FIG. 2 also shows the mounting of the inner pole pieces. The inner upper pole piece 13 is separated from the outer lens body by an annular spacer 20 made of a physically soft, non-magnetic material (e.g. silicone rubber). The inner lower pole piece 14 is adhesively bonded (e.g. by epoxy adhesive such as Dow Corning 404) to the outer lower pole piece 12 through a thin-walled cylindrical ring 21 that flexes radially to accommodate differential thermal expansion between the different materials. The inner upper and lower pole pieces and shielding rings 13, 14, 15 are positioned with a thin-walled cylindrical shield ring mount 22 and adhesively bonded together. Shield ring mount 22 thus bears the weight of upper pole 13 and shield rings 15. Mount 22 is of a high resistivity, non-magnetic material such as titanium whose thermal expansion coefficient matches that of the inner pole pieces. As the diameters of the parts change, the thin walled cylindrical parts 21, 22 change their diameter by stretching, but they resist shear motion. This adhesively bonded, radial flexure design allows only elastic radial expansion with no slippage; hence the central axis of the lens field remains stationary in spite of small changes in inner or outer pole piece temperature.

Figure 3A:
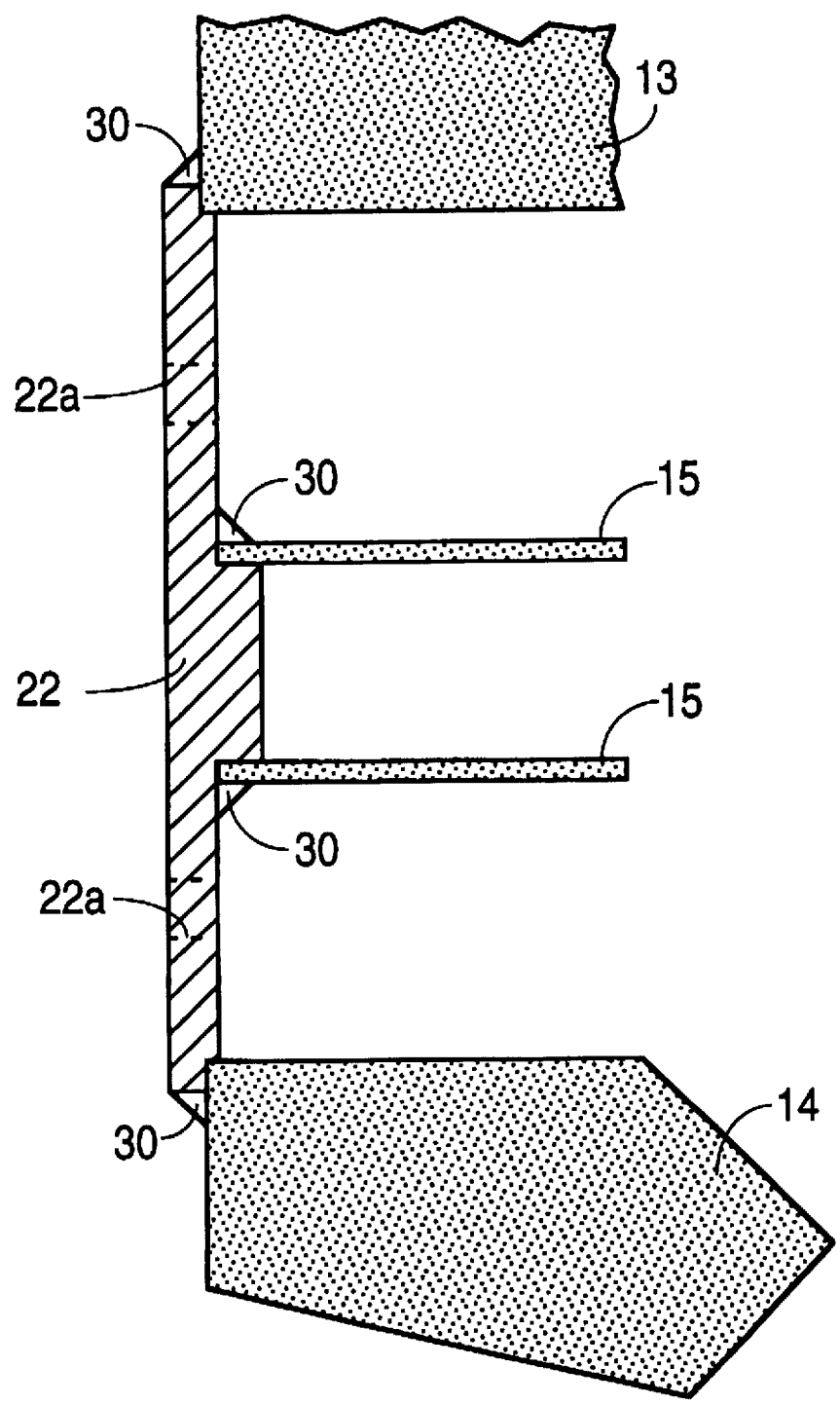
FIGS. 3A and 3B show detail of the structure of FIG. 2.

Details of shield ring mount 22 (which is one piece) are shown in FIG. 3A, also showing associated structure including shield rings 15, lower pole pieces 14 and upper pole piece 13 as in FIG. 2. This entire assembly is adhesively bonded together at points 30 by glue fillets. Shield ring mount 22 includes a plurality of radial cut outs (defined by lines 22a) to minimize the volume of metal of mount 22.

Figure 3B:
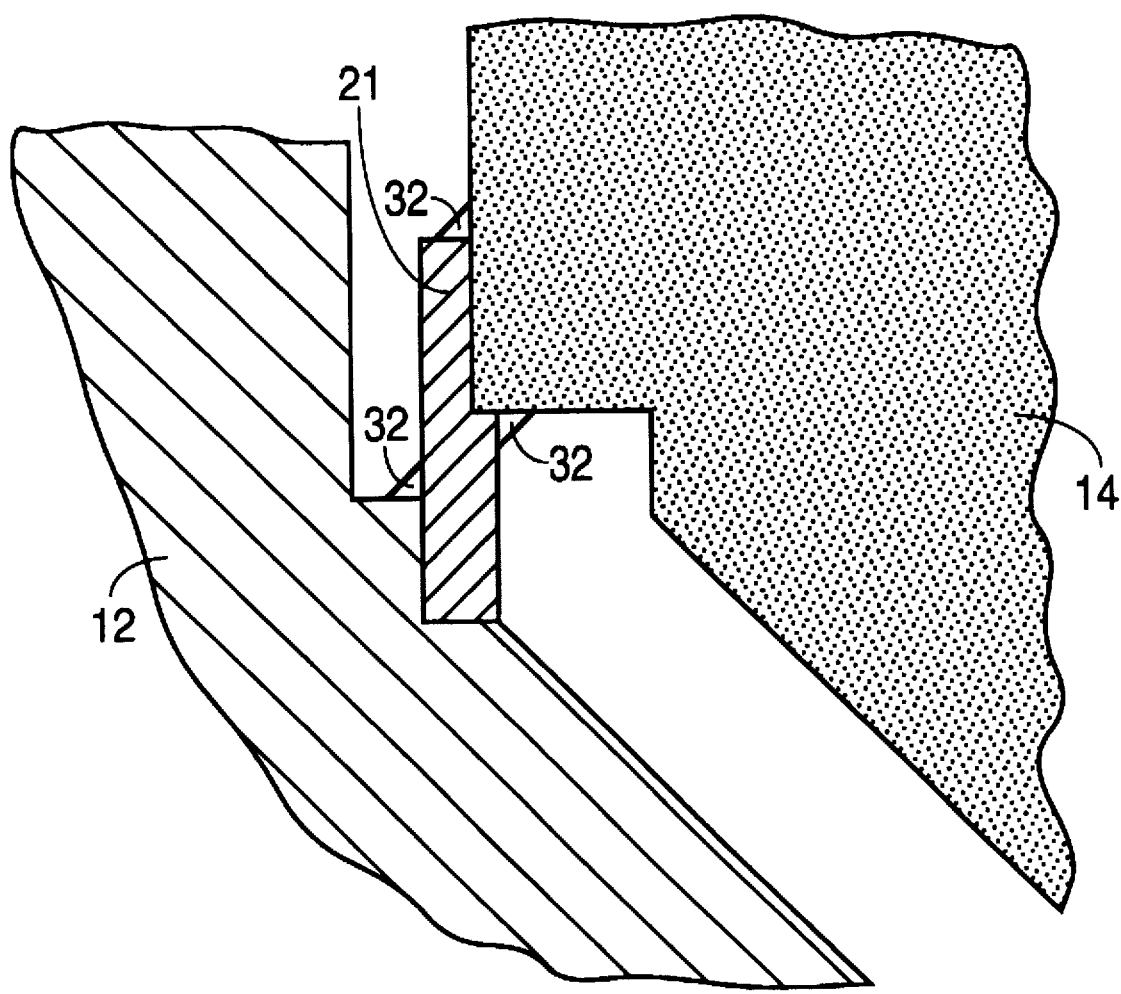

Similarly, detail of flexure 21 (the cylindrical ring between outer lower pole 12 and lower inner pole piece 14) is shown in FIG. 3B, and again this assembly is adhesively bonded together at points 32 for rigidity except in the radial direction as permitted by flexure 21 (e.g. of titanium) which similarly includes a number of radial cut outs (not shown).

In one embodiment, the present conical pole piece structure is used in conjunction with a conical baffle mounted inside the cone defined by the lower inner pole pieces 12, to prevent secondary or backscattered radiation from entering into the beam tube (not shown) see copending U.S. patent application Ser. No. 08/733,673, entitled "Conical Baffle For Reducing Charging Drift in A Particle Beam System", invented by Lee H. Veneklasen and Lydia J. Young, incorporated herein by reference. In one embodiment a detector assembly to sense backscattered or secondary particles is also mounted inside the cone, just below the baffle; see copending U.S. patent application Ser. No. 08/726,449, entitled "Mounting A Solid State Particle Detector Within A Magnetic Deflection Field", invented by Lee H. Veneklasen and Rudy Garcia, also incorporated herein by reference.

This disclosure is illustrative and not limiting; further modifications will be apparent to one skilled in the art and are intended to fall within the scope of the appended claims.

We claim:

1. A composite lens and magnetic deflector for a particle beam comprising deflection coils and having an upper inner pole piece and a lower inner pole piece, the lower inner pole piece being spaced apart by a gap from the upper inner pole piece; and the upper inner pole piece surrounding a deflection coil;

further comprising:

an outer pole structure having an outer upper pole surrounding the upper inner pole piece and an outer lower pole surrounding the lower inner pole piece, wherein the lower inner pole piece defines a conical structure having an opening concentric to the particle beam and having its base nearer the upper inner pole piece than is the opening.

2. The lens and deflector of claim 1, further comprising at least one shield ring of a high resistivity material and concentric to the beam and located in the gap.

3. The lens and deflector of claim 2, further comprising at least one or more additional shield ring of a high resistivity material and concentric to the beam and located in the gap, and spaced apart from the first shield ring.

4. The lens and deflector of claim 2, further comprising a structure concentric to the shield ring and pole pieces and attaching the shield ring to the upper and lower inner pole pieces.

5. The lens and deflector of claim 4, wherein the shield ring is of a high resistivity non-magnetic material.

6. The lens deflector of claim 1, wherein the lower outer pole is of a conical shape, having an opening concentric to the particle beam, a base of the cone being nearer to the upper outer pole than is the opening.

7. The lens and deflector of claim 4, wherein the shield ring and the upper and lower inner pole pieces are adhesively bonded to the annulus.

8. The lens and deflector of claim 1, further comprising a flexure coupling the lower inner pole piece to the lower outer pole piece.

9. The lens and deflector of claim 1, wherein the flexure flexes in a direction radial to an apex of the beam.

10. The lens and deflector of claim 1, wherein the upper outer pole is spaced apart from the upper inner pole piece by a flexible spacer.

11. The lens and deflector of claim 4, wherein the structure is of a material having a thermal coefficient of expansion approximately equal to that of the upper and lower inner pole pieces.

12. The lens and deflector of claim 1, wherein a portion of the lower pole surrounding the opening is tapered in cross section towards the opening.

13. The lens and deflector of claim 1, further comprising at least one deflection coil located inside the upper and lower inner pole pieces.

14. The lens and deflector of claim 13, wherein the coil is a saddle coil.

15. The lens and deflector of claim 13, wherein the coil is a toroidal coil concentric to the beam.

16. The lens and deflector of claim 15, further comprising an additional coil concentric to the beam and located at least partly in the gap.

* * * * *